United States Patent

[11] 3,616,348

[72] Inventor William J. Greig
Somerville, N.J.
[21] Appl. No. 735,642
[22] Filed June 10, 1968
[45] Patented Oct. 26, 1971
[73] Assignee RCA Corporation

[54] PROCESS FOR ISOLATING SEMICONDUCTOR ELEMENTS
13 Claims, 2 Drawing Figs.

[52] U.S. Cl. .......... 204/143 R, 204/143 GE
[51] Int. Cl. .......... B23p 1/00
[50] Field of Search .......... 204/143, 143 GE

[56] References Cited

UNITED STATES PATENTS

| | | | |
|---|---|---|---|
| 3,067,114 | 12/1962 | Tiley et al. | 204/143 |
| 3,418,226 | 12/1968 | Marinace | 204/143 |
| 3,427,563 | 1/1969 | Lasher | 331/94.5 |

FOREIGN PATENTS

| | | | |
|---|---|---|---|
| 742,188 | 9/1966 | Canada | 204/143 |

*Primary Examiner*—John H. Mack
*Assistant Examiner*—Neil A. Kaplan
*Attorney*—Glenn H. Bruestle

ABSTRACT: In the manufacture of beam lead integrated circuits or discrete devices, each operating semiconductor portion of one conductivity type is surrounded by substrate material of opposite conductivity type. The substrate material is removed by a preferential electrolytic etching process to provide isolation between each of the semiconductor-operating portions.

INVENTOR
WILLIAM J. GREIG
BY [signature]
ATTORNEY

PROCESS FOR ISOLATING SEMICONDUCTOR ELEMENTS

BACKGROUND OF THE INVENTION

This invention relates to processes for simultaneously manufacturing a number of electrically-isolated semiconductor elements.

In the manufacture of semiconductor devices, a large number of devices is usually fabricated on a single semiconductor wafer. The wafer is then divided, usually by scribing and breaking, into a corresponding number of semiconductor dice, each die comprising an integrated circuit or a discrete semiconductor device such as a diode or transistor.

The scribing and breaking techniques presently being utilized in semiconductor device manufacture require the sacrifice of a considerable amount of semiconductor wafer area, since the accuracy with which these techniques may be practically carried out is limited. These scribing and breaking techniques usually result in a considerable number of cracked dice, which must be discarded.

Where an integrated circuit is to be provided on each die, some technique must be employed for providing electrical isolation between the various semiconductor active and/or passive elements formed in the die. Conventional techniques, employing reverse biased PN junctions to provide such isolation, provide circuits of limited frequency response, due in part to capacitive effects associated with the isolating junctions.

A number of techniques have therefore been proposed to provide dielectric rather than reverse biased junction isolation between the semiconductor elements of an integrated circuit.

One of these dielectric isolation techniques, known as the beam-lead process, involves the removal of all semiconductor material between the operating elements of an integrated circuit. These operating elements are electrically and mechanically interconnected by relatively massive deposited metallic leads, known as beam leads, which provide the requisite mechanical rigidity for holding the integrated circuit elements together as a unitary structure.

By employing the beam lead process, a large number of integrated circuits or discrete devices may be formed on a semiconductor wafer, with the individual circuits or devices being automatically separated (without the need for scribing and breaking) upon removal of the inactive semiconductor substrate material.

These beam lead processes are well known in the art and are described, e.g., in U.S. Pat. Nos. 3,287,612 and 3,335,338, as well as in the following articles:

M. P. Lepselter, "Beam-Lead Technology," The Bell System Technical Journal, vol. 45, No. 2, (Feb. 1966), pp. 233–253; and S. S. Hause and R. A. Whitner, "Manufacturing Beam Lead, Sealed-Junction Monolithic Integrated Circuits," Western Electric Engineer, Dec. 1967, pp. 3–15.

The beam-lead process, however, is an extremely complex one, involving a number of rather difficult operations. One particularly difficult and expensive operation is the removal of the inactive semiconductor substrate material after (i) formation of the various semiconductor elements by diffusion processes, and (ii) deposition of the beam leads.

In the manufacture of beam lead integrated circuits or discrete devices according to the processes heretofore known, each active or passive semiconductor element is formed by diffusion of suitable conductivity type determining impurities into an epitaxial layer grown on a suitable semiconductor substrate. After deposition of beam leads interconnecting selected elements (in the case of integrated circuits) or merely providing terminal leads for these elements (in the case of discrete devices), the semiconductor substrate as well as the portions of the epitaxial layer between the semiconductor elements are removed.

Heretofore, this removal process has been carried out by first reducing the thickness of the semiconductor wafer to a value on the order of 2 to 3 mils, and then selectively etching the back surface (i.e., the surface opposite that having the epitaxial layer in which the various semiconductor elements are formed) of the wafer to remove all semiconductor material except that comprising the semiconductor elements formed in the epitaxial layer.

The wafer thinning and selective-etching processes are usually carried out by bonding the surface of the wafer upon which the beam leads are deposited to a sapphire disk, and then lapping the back surface of the wafer to the desired 2- to 3-mil thickness. The back surface of the wafer is then coated with photoresist, and the photoresist is exposed through a suitable mask to define the semiconductor areas to be removed to isolate the various elements.

The mask is aligned by viewing the back surface of the substrate under infrared light (to which the photoresist is insensitive) directed through the sapphire disk and the semiconductor wafer. The sapphire disk, as well as the thinned wafer, transmits sufficient infrared light so that an operator utilizing a microscope equipped with an infrared image converter can properly align the mask.

After exposure through the aligned mask, the photoresist pattern is developed and the substrate is immersed in an etching solution to remove the undesired portions of the substrate and epitaxial layer. The sapphire disk protects the semiconductor elements from deterioration or destruction by the etching solution.

The above-described isolation process is a rather costly one, since a large number of the expensive sapphire disks must be employed where large-scale manufacturing is contemplated.

The wafer-thinning operation is also a critical and an expensive one, since the lapping process must be carried out so that the back surface of the substrate remains exactly parallel to the epitaxial layer. If this is not accurately done, inclination or "wedging" of the wafer occurs, with the net result that portions of the epitaxial layer may be inadvertently removed, thus destroying desired semiconductor elements. The "wedging" effect also interferes with the subsequent etching step, since the resultant wafer is of varying thickness.

SUMMARY OF THE INVENTION

A semiconductor device manufacturing process in which a substrate is provided having a given surface and comprising (i) a semiconductor body of one conductivity type and (ii) a number of operating semiconductor portions of opposite conductivity type. The operating semiconductor portions are inset into the semiconductor body from the aforementioned given surface and are surrounded by the body. Each operating portion includes a semiconductor element having at least one contact area exposed at the given surface.

Metallic interconnections are provided on the given surface between selected contact areas. The semiconductor body is preferentially etched without substantially affecting the operating portions to separate the substrate into a corresponding number of isolated parts.

IN THE DRAWING

FIG. 1 shows a cross-sectional view of a portion of a beam lead integrated circuit at an intermediate stage of manufacture, according to a preferred embodiment of the invention; and FIG. 2 shows the structure of FIG. 1 at a later step in the manufacturing process.

DETAILED DESCRIPTION

The aforementioned disadvantages inherent in the prior art beam lead techniques may be alleviated, and the wafer thinning and infrared alignment steps, as well as the need for a sapphire disk, completely eliminated by means of the process which will now be described in conjunction with FIGS. 1 and 2.

Figure 1:
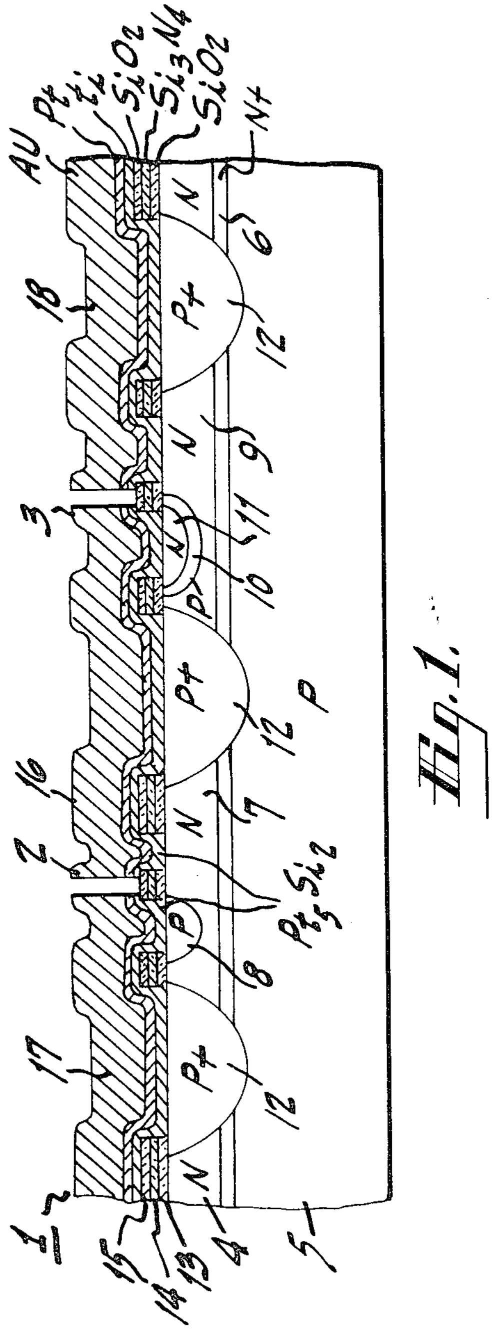

The beam lead integrated circuit 1, shown in FIG. 1, comprises a silicon diode 2 electrically connected in series with the emitter of a silicon transistor 3. These elements are formed in an N-type silicon layer 4 which has been epitaxially grown on a P-type silicon substrate 5. In order to reduce the saturation resistance of the semiconductor elements 2 and 3, a low resistivity $N^+$-type layer 6 has been diffused into the upper surface of the P-type substrate 5 before growth of the epitaxial N-type layer 4 thereon.

The diode 2 comprises an N-type operating region 7 and a P-type region 8 which has been formed by diffusion of a suitable acceptor impurity material from the upper surface of the wafer.

Similarly, the transistor 3 comprises an N-type operating collector region 9 into which there has been diffused a P-type base region 10. An N-type emitter region 11 has been diffused into the base region 10.

The N-type operating portions of the diode 2 and transistor 3 are completely surrounded by P-type semiconductor material. This is accomplished by diffusing acceptor impurities into the epitaxial layer 4 and low resistivity $N^+$ layer 6, to form a $P^+$ ring 12 around each element. The $P^+$ rings 12 extend completely through the epitaxial layer 4 and diffused layer 6, so that these rings, in cooperation with the P-type substrate 5, completely surround each operating region with semiconductor material of opposite conductivity type.

Each of the regions 7 to 11 of the semiconductor elements 2 and 3 has an associated contact area at the upper surface of the semiconductor wafer. An insulating laminate comprising a first silicon dioxide layer 13, a silicon nitride layer 14, and a second silicon dioxide layer 15 (which has been employed as a mask for etching of the silicon nitride layer 14) is disposed on the upper surface of the semiconductor wafer. The layer 15 may be removed, if desired, or left in place during subsequent processing steps. This insulating laminate protects the various PN junctions and operating semiconductor regions from contamination by deleterious ingredients in the surrounding atmosphere. The insulating laminates have apertures exposing the contact areas of the semiconductor regions 7 to 11 as well as portions of the isolating rings 12.

Electrodes comprising thin platinum silicide layers are disposed on the contact areas of the semiconductor regions 7 to 11 as well as on the exposed surface portions of the isolating rings 12.

A beam lead 16 provides electrical and mechanical coupling between the contact area of the N-type region 7 of the diode 2 and the contact area of the emitter region 11 of the transistor 3. After beam lead 17 provides electrical and mechanical coupling between the contact areas of the P0type region 8 of the diode 2 and another semiconductor element (not shown) of the integrated circuit 1. Similarly, a beam lead 18 provides electrical and mechanical coupling between the contact areas of the collector region 9 of the transistor 3 and another semiconductor element (not shown) of the integrated circuit 1. Another beam lead (not shown) couples the base region 10 of the transistor 3 to an associated part of the integrated circuit.

Each of the beam leads 16 to 18 comprises a laminate of titanium, platinum and gold which is manufactured according to processes well known in the art and described in the previously mentioned references. The overall thickness of beam leads 16 to 18 may be on the order of 0.5 mil.

In order to isolate the diode 2 and the transistor 3 from each other and from other portions of the integrated circuit 1 by means other than the relatively unsatisfactory reverse biased PN junctions provided by the isolating rings 12 and substrate 5, it is necessary that the substrate 5 and isolating rings 12 be removed.

Figure 2:
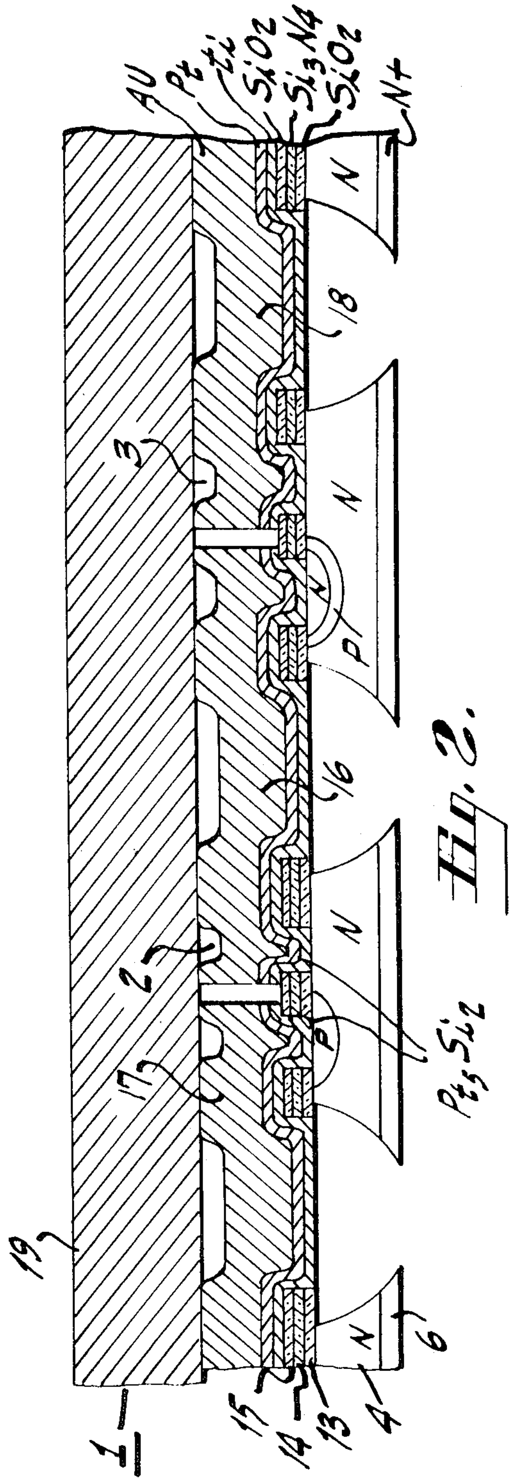

This removal step is carried out, as illustrated in FIG. 2, by a preferential etching process in which a molybdenum or other suitable metallic electrode 19, in the form of a disk, is placed in electrical contact with the various beam leads 16 to 18 of the integrated circuit 1. These beam leads are as previously mentioned in electrical contact with the isolating rings 12.

The integrated circuit 1 and electrode 19 are then immersed in an etching solution which preferentially dissolves P-type silicon without substantially affecting N-type silicon material, and a voltage is applied between the electrode 19 and another electrode which is immersed in and makes electrical contact to the etching solution itself. The voltage is unidirectional, with a polarity such that the electrode 19 is relatively positive.

A suitable etching solution for this purpose is an aqueous solution of hydrofluoric acid and acetic acid in water. We prefer to employ the following preparation for this purpose:

5 parts (by volume) concentrated (48 percent by weight) hydrofluoric acid;
2 parts (by volume) water;
7 parts (by volume) glacial acetic acid.

The magnitude of the applied voltage is selected to provide a current density on the order of 0.44 amp/cm.$^2$ at the substrate back surface.

The consequent electrolytic etching action removes the P-type semiconductor material of the substrate 5 as well as the $P^+$-type isolating rings 12, to provide air isolation between the diode 2 and transistor 3. Due to their high doping level, the $P^+$ isolating rings are etched quite rapidly. The P-type regions 8 and 10 of the diode 2 and transistor 3 are protected against the etching solution by the insulating layers 13 to 15 and the beam leads 16 to 18. The resultant structure, after the inactive semiconductor material has been removed, is as shown in FIG. 2.

The use of the electrode 19, in contact with the beam leads 16 to 18, for the electrolytic-etching step ensures uniform current density during the etching operation, thus preventing undesired side effects and assuring uniform etching.

I claim:

1. A semiconductor device manufacturing process comprising the steps of:
   - providing a substrate of semiconductor material of one conductivity type;
   - forming two spaced-apart first regions each of a conductivity opposite to said one conductivity within said substrate at a surface thereof;
   - providing within each of said first regions, at said substrate surface, second regions of said one conductivity type, said second regions being wholly enclosed by said first regions within said substrate;
   - sealing said surface with a material resistant to a preselected etchant of said one conductivity type material;
   - providing spaced apart openings through said resistant material to expose surface portions of said substrate outside said first regions and within each of said first regions;
   - providing a metallic interconnection on said surface connecting said exposed surface portions of said two first regions;
   - immersing said substrate in said etchant, and
   - applying a voltage between said substrate, via said exposed surface portions outside said first regions, and said etchant to etch said one conductivity type material of said substrate between said first regions while not etching said one conductivity type material within said first regions.

2. A process according to claim 1 wherein said metallic interconnection contacts a substrate exposed surface portion outside said first regions, and the voltage is applied to said substrate via said interconnection.

3. A process according to claim 1 wherein said openings expose surface portions of said second regions, and said metallic interconnection seals said second region exposed surface portions against said etchant.

4. A process according to claim 1, wherein said interconnection provides both electrical and mechanical coupling between said two first regions.

5. A process according to claim 1, wherein said semiconductor body is of P-type conductivity.

6. A process according to claim 5, wherein said etched semiconductor body comprises silicon and said etching solution comprises hydrofluoric acid, acetic acid and water.

7. A semiconductor device manufacturing process comprising the steps of:

providing a substrate comprising a body of semiconductor material of one conductivity type covered by an epitaxial layer of opposite conductivity type;

forming rings of said one conductivity type extending entirely through said epitaxial layer, the portions of said epitaxial layer within said rings comprising spaced apart regions of opposite conductivity type;

forming in each of said regions at least one semiconductor element having at least one contact area at a surface of said epitaxial layer;

providing a metallic layer on said surface extending between and electrically coupled to said contact areas; and immersing said substrate in an electrically conductive etching solution and applying a voltage between said rings and said solution to etch said material of one conductivity type outside said regions.

8. A process according to claim 7, wherein said metallic layer is of sufficient thickness to provide mechanical as well as electrical coupling between the contact areas.

9. A process according to claim 8, wherein said semiconductor body and said isolating rings are of P-type conductivity.

10. A process according to claim 9, wherein the conductivity type determining impurity concentration within each of said isolating rings is substantially greater than the conductivity type determining impurity concentration within the adjacent part of each corresponding region.

11. A process according to claim 8, wherein said preferential etching step comprises:

contacting said layer with each of said isolating rings; and applying a voltage between said layer and said etching solution to preferentially etch said semiconductor body and isolating rings.

12. A process according to claim 11, wherein said semiconductor body and isolating rings are of P-type conductivity.

13. A process according to claim 12, wherein said etching solution comprises an aqueous solution of hydrofluoric and acetic acids.

* * * * *